Dec. 29, 1964 G. N. HOWATT ETAL 3,163,783

HIGH CAPACITY TRANSDUCER UNIT

Filed June 10, 1963 2 Sheets-Sheet 1

INVENTORS
GLENN N. HOWATT
EDITH M. GULTON
BY Wallenstein Spangenberg & Hattis
ATTYS.

HIGH CAPACITY TRANSDUCER UNIT

Filed June 10, 1963 2 Sheets-Sheet 2

INVENTORS
GLENN N. HOWATT
EDITH M. GULTON
BY
Wallenstein, Spangenberg & Hattis
ATTYS.

United States Patent Office 3,163,783
Patented Dec. 29, 1964

3,163,783
HIGH CAPACITY TRANSDUCER UNIT

Glenn N. Howatt and Edith M. Gulton, Metuchen, N.J., assignors to Gulton Industries, Inc., Metuchen, N.J., a corporation of New Jersey
Filed June 10, 1963, Ser. No. 286,575
8 Claims. (Cl. 310—8.6)

The present invention relates to piezoelectric transducers having a high capacitive impedance. Among the many important applications of such transducers is in phonograph pickup devices.

The advent of transistorized amplifiers in phonograph pickup and other amplifiers connected to piezoelectric transducers has made it desirable to have transducers with high capacitive impedances to match the impedances of the transistorized amplifiers. The requirement of a high transducer capacitance heretofore has been difficult to achieve without sacrificing compactness and sensitivity.

One of the objects of the invention is, therefore, to provide a piezoelectric transducer useful, for example, as a phonograph pickup device or the like, which has a substantially higher capacitive impedance for its size than piezoelectric transducers of equivalent size heretofore made. A related object of the invention is to provide a piezoelectric transducer as described where the increased capacity is achieved without any substantial reduction in sensitivity. Still another related object of the invention is to provide a piezoelectric transducer as described which is easy to assemble and is otherwise of simple and economical construction.

In the most preferred form of the present invention, the transducer comprises a compact laminate body having centrally disposed therein a high dielectric constant capacitor desirably formed by a thin sheet of ceramic material having conductive layers on the opposite sides thereof serving as plates of the capacitor, and a pair of piezoelectric elements positioned on opposite sides of the capacitor and desirably formed by a pair of sheets of ferroelectric ceramic material with conductive layers disposed on the opposite sides thereof forming electrodes therefor. The inner conductive layers of the capacitor and piezoelectric elements may be formed by the same or separate conductive layers. In any event, the confronting sides of the ceramic sheets of the capacitor and piezoelectric sheets are most desirably in physical and electrical contact to form a monolithic unit where the plates of the capacitor are electrically connected between the inner electrodes of the piezoelectric elements. Where the transducer is a phonograph pickup device, the laminate body preferably has an elongated rectangular shape with the lamina thereof extending in planes parallel to the plane of the phonograph needle. The needle is connected to one end of the laminate body. The other end of the laminate body is anchored in place so that the laminate body forms a cantilevered beam which is flexed transversely of the planes of the body lamina by the record grooves. Since the piezoelectric elements are on opposite sides of the medial plane of the laminate body and the capacitor occupies the center portion of the body including this plane, a given degree of flexure imparted thereto will place one of the piezoelectric elements in maximum compression and the other in maximum tension.

The requirement of a high capacitive impedance is best achieved by interconnections between the various conductive layers of the laminate body which effectively connect the piezoelectric elements in parallel with the capacitor and the output terminals of the laminate body. In accordance with a specific aspect of the invention, these interconnections are most advantageously achieved by terminating the conductive layer or layers constituting the inner electrode of one of the piezoelectric elements and the contiguous capacitor plate short of one of the end edges of the laminate body, the layer or layers involved extending to the edge at the opposite end of the body. The layer or layers constituting the inner electrode of the other piezoelectric element and the contiguous capacitor plate are terminated short of the latter end of the body and extend to the edge of the body at the former end thereof. The output terminals of the laminate body are connected to the outermost conductive layers thereof. The extent and arrangement of the inner conductive layers described above makes possible the completion of the parallel circuit by simply applying conductive coatings to the opposite ends of the laminate body. This interconnects the outer electrode of each piezoelectric element with the inner electrode of the other, which places the capacitor and piezoelectric elements in parallel.

Where the piezoelectric elements are ferroelectric ceramic materials which are pre-polarized, the sense or direction of the polarization of one of the piezoelectric elements is made opposite that of the other in terms of their electrical relationship, so that the voltages outputs of the parallel connected elements are in aiding rather than in opposing relation when one is in tension while the other is in compression. The piezoelectric elements may be polarized prior to the application of the conductive coatings on the edges of the laminate transducer by connecting one of the terminals of a source of direct current voltage to the outermost electrodes of the piezoelectric elements and the opposite terminal thereof to the innermost electrodes thereof.

The transducer of the invention provides a very high capacity with a surprisingly low loss in sensitivity. By placing the capacitor in the central portion of the transducer body, the piezoelectric elements are placed in the regions of the transducer subjected to the maximum tension and compressive forces, thereby maximizing the voltage output of the transducer unit. The construction of the transducer unit just described is of exceedingly simple and economical construction and is easy to assemble.

Other objects, advantages and features of the present invention will become apparent upon making reference to the specification to follow, the claims and the drawings wherein:

Figures 3, 4, 5:
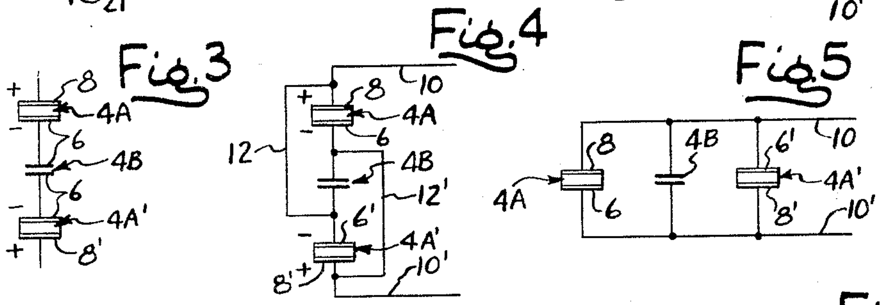
FIG. 3 is an electrical diagram of the internal connections between the piezoelectric and capacitor elements of the transducer of the invention and shows the direction of polarization of the piezoelectric elements indicated thereon.
Figure 6:
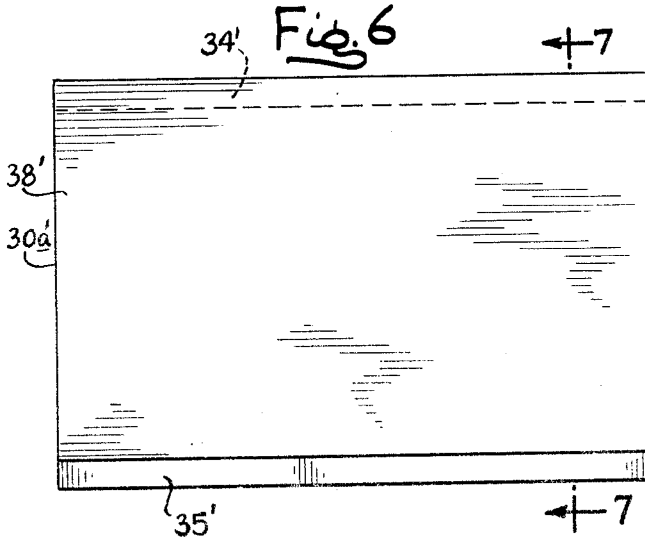
Figure 7:
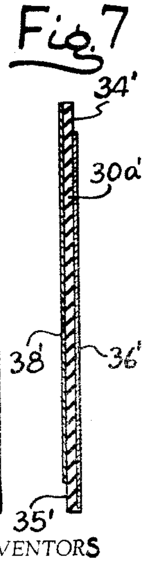
Figures 8, 9, 10, 11:
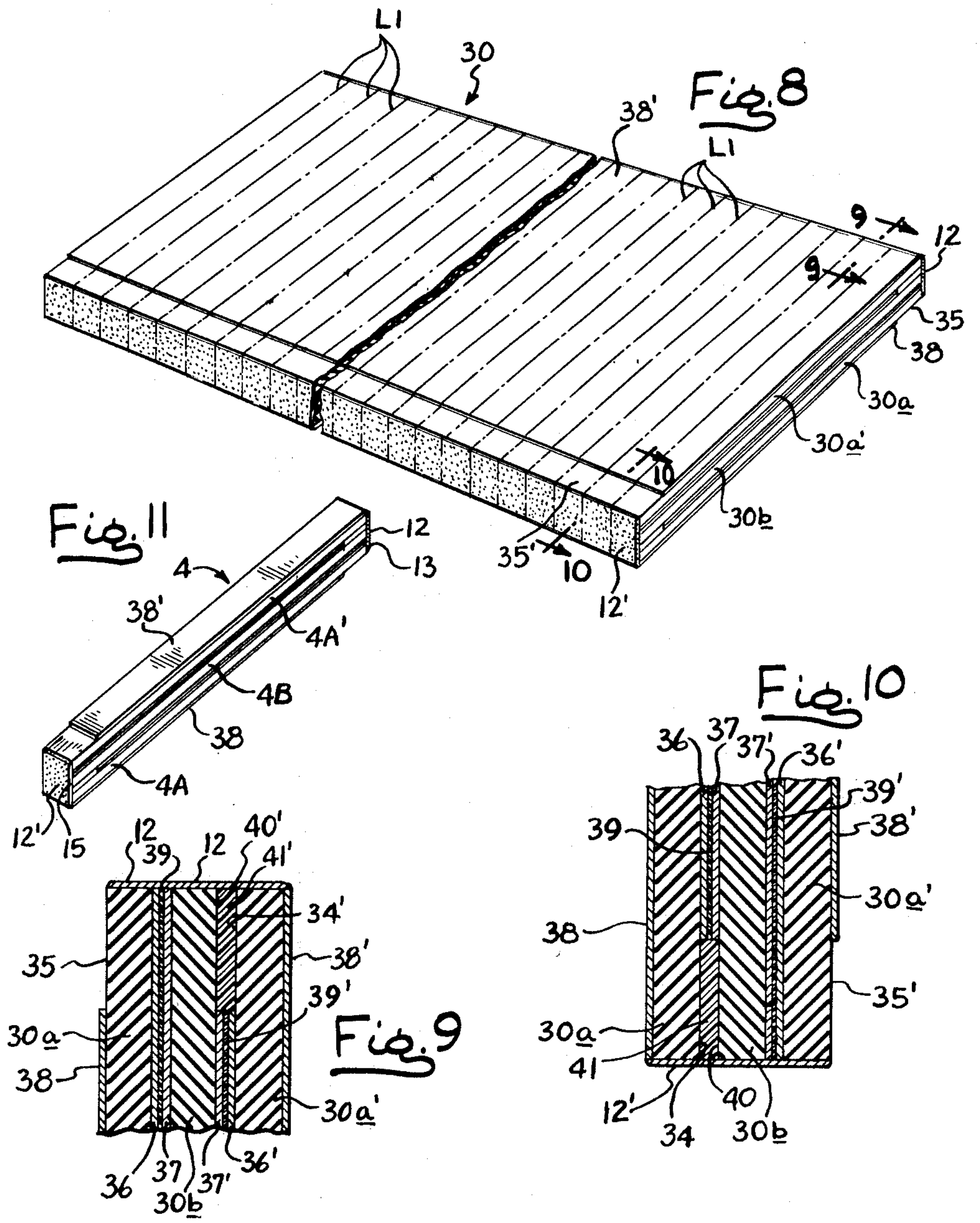

FIG. 4 adds to FIG. 3 the external connections made to the piezoelectric and capacitor elements of the transducer;

FIG. 5 is a redrawing of the electrical diagram of FIG. 4 and shows, in a more simple manner, the electrical relationship between the elements of the transducer;

FIG. 6 is a view showing a sheet of piezoelectric material used to construct a laminate blank from which transducers of the present invention are made;

FIG. 7 is a sectional view through the sheet of FIG. 6;

FIG. 8 is a view of a completed laminate blank from which transducer bodies of the invention are cut;

FIG. 9 is an enlarged fragmentary sectional view through the laminate blank of FIG. 8, taken substantially along the line 9—9 thereof;

FIG. 10 is an enlarged fragmentary sectional view through the laminate blank of FIG. 8, taken substantially along the line 10—10 thereof; and FIG. 11 is a perspective view of a transducer body severed from the laminate blank of FIG. 8.

Figures 1, 2:
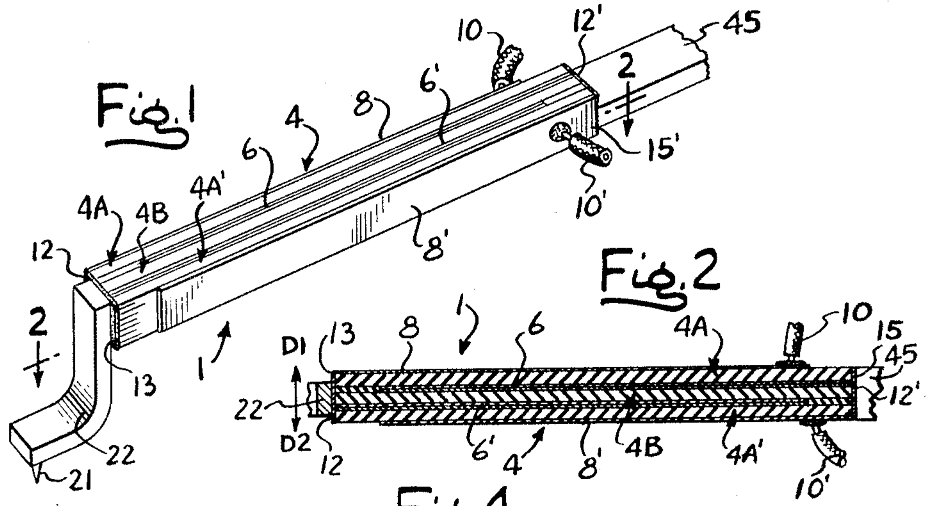
FIG. 1 is a perspective view of a phonograph pickup constructed in accordance with the present invention.
FIG. 2 is an enlarged transverse section through the transducer unit of FIG. 1, taken substantially along the line 2—2 thereof.

Refer now more particularly to FIGS. 1 and 2, where a phonograph pickup device 1 constructed in accordance with the present invention is illustrated. This device includes an elongated laminate transducer body 4 comprising three sheets 4A, 4B and 4A' of ceramic material interconnected by internal layers or surfaces 6 and 6' of conductive material. The outer sides of the outermost sheets 4A and 4A' of ceramic material have conductive layers or surfaces 8 and 8' thereon.

The outermost ceramic sheets 4A and 4A' are made of a piezoelectric material, most preferably a ferroelectric ceramic material, such as barium titanate, lead zirconate-titanate, etc. which provides a voltage when placed under a dynamic stress. The conductive layers 6 and 8 on the opposite sides of the ceramic sheet 4A constitute inner and outer electrodes for a piezoelectric element formed thereby which will be referred to as piezoelectric element 4A. The conductive layers 6' and 8 on the opposite sides of the ceramic sheet 4A' constitute inner and outer electrodes for a piezoelectric element formed thereby which will be referred to as piezoelectric element 4A'. The intermediate sheet 4B of ceramic material constitutes the dielectric of a capacitor to be referred to as capacitor 4B. The outer plates of the capacitor 4B are formed by the conductive layers 6 and 6'.

The inner and outer conductive layers 6, 6', 8 and 8' may each comprise a separate conductive coating, for example, applied to a surface of the associated ceramic sheets by a process involving the application of silver frit to the ceramic material making up the sheet before the firing thereof in the manner well known in the art of making ferroelectric ceramic sheets, the frit melting into a thin even coating during the firing operation. The piezoelectric and capacitor elements forming the transducer sandwich are then stacked and formed into a monolithic unit by a suitable conductive adhesive applied between the contiguous conductive coatings of the sheets. In the alternative, the conductive layers 6, 6', 8 and 8' may each comprise a single platinum or similar metallic sheet bonded to the contiguous ceramic sheet by the same firing operation which converts the raw ceramic material into the finished sheet. The finished laminate transducer body 4 comprises two piezoelectric elements 4A and 4A' electrically and physically interconnected by capacitor 4B, as shown diagrammatically in FIG. 3.

As is well known, the piezoelectric properties of ferroelectric ceramic materials is obtained by polarizing the ferroelectric material. For reasons to be explained, the ferroelectric ceramic sheets 4A and 4A' are polarized by connecting one of the terminals of a source of direct current voltage to the outer conductive layers or electrodes 8 and 8' and the other terminal thereof to the inner conductive layers or electrodes 6 and 6', as diagrammatically illustrated in FIG. 3.

The output leads of the transducer indicated by reference numerals 10 and 10' in FIGS. 1 and 2 are shown therein extending to the outer conductive layers or electrodes 8 and 8' of the transducer unit. The interconnections between the output leads 10 and 10' and the inner electrodes or conductive layers 6 and 6' of the transducer are made in the manner diagrammatically illustrated in FIG. 4, where a conductive path 12 connects the outer electrode 8 of one of the piezoelectric elements to the inner electrode 6' of the other piezoelectric element and a conductive path 12' connects the outer electrode 8' of the latter piezoelectric element to the inner electrode 6 of the former piezoelectric element. When the circuit of FIG. 4 is redrawn in the manner shown in FIG. 5, it is apparent that the resultant circuit electrically connects the piezoelectric and capacitor elements of the transducer in parallel with the output leads 10 and 10', and so the capacities of the piezoelectric elements are additive to the capacity of the capacitor 4B.

The conductive paths 12 and 12' are most advantageously formed by conductive coatings 12 and 12' applied over the opposite end edges 13 and 15 of the laminate transducer body 4. Electrical separation between the conductive coating 12 and the inner electrode 6 is effected by terminating the conductive layer forming this electrode short of the end edge 13 of the laminate body 4. Electrical connection between the conductive coating 12 and the internal electrode 6' is achieved by extending the conductive layer forming this electrode to the end edge 13 of the laminate transducer body 4. In a like manner, electrical isolation between the conductive coating 12' and the inner electrode 6' is achieved by terminating the conductive layer forming the electrode short of the end edge 15 of the laminate body 4, and electrical connection between the conductive coating 12' and the inner electrode 6 is achieved by extending the conductive layer constituting this electrode to the end edge 15 of the laminate body.

Referring particularly to FIG. 5, in order for the voltage outputs of the piezoelectric elements 4A and 4A' to be in voltage aiding relationship in the parallel circuit shown, a stress applied to one of the piezoelectric elements 4A by flexing of the laminate transducer body 4 in a direction D1 (FIG. 2) transverse to the lamina thereof must result in a voltage between the outer and inner electrodes 8 and 6 thereof which is the same polarity as the voltage between the inner and outer electrodes 6'–8' developed by the stress produced in the piezoelectric element 4A' by such flexure. This result is achieved by the polarization of the piezoelectric elements in the manner previously described and illustrated in FIGS. 3–5.

Where the transducer of the invention is applied to a phonograph pickup device, a phonograph needle 21 is secured by a carrier bar 22 or the like to one of the ends of the transducer, so that the phonograph needle is in a plane parallel to the planes of the layers making up the laminate transducer body 4. As is well known, the phonograph needle 20 is deflected by the sides of the record grooves which would flex the transducer in the direction D1 or D2, assuming the opposite end thereof is anchored.

Refer now to FIGS. 6 through 11 which illustrate one advantageous method of making the laminate transducer body 4 described above which involves the fabrication of a rectangular laminate blank 30 shown in FIG. 8 from which individual transducer bodies are cut. The laminate blank 30 has a width approximately equal to the length of the desired laminate transducer body 4 and a length many times longer than the width thereof. This laminate blank 30 may be built up initially from two outer plates or sheets 30*a* and 30*a'* of a desired piezoelectric material for forming the piezoelectric elements 4A and 4A' and an intermediate plate or sheet 30*b* of high dielectric material for forming the capacitor 4B. Each of these sheets is made like the sheet 30*a'* shown in FIGS. 6 and 7. The sheet 30*a'* has a conductive coating or layer 38' on one side thereof which covers the entire length of the elongated rectangular sheet involved except for a narrow strip 35' along one longitudinal edge thereof. Although, as previously indicated, the conductive layer 38' could be a sheet of platinum, the conductive layer 38' is preferably a coating applied to the sheet 30*a'* before the laminate blank 30 is fabricated. The other side of the sheet 30*a'* has a similarly applied conductive coating 36' which covers the entire inner surface of the sheet except for a narrow strip 34 along the opposite longitudinal edge of the sheet.

As indicated above, the other piezoelectric sheet 30*a* is formed in the same way as sheet 30*a'* just described and the corresponding parts thereof are similarly numbered, except that the prime (') has been omitted. The sheet 30*a*, however, in the completed blank has been turned around so that the uncoated strip 35 thereof extends along the opposite longitudinal edge of the laminate blank 30 (see FIGS. 8 and 9).

The ceramic sheet 30*b* is of similar over-all shape and construction as the sheets 30*a* and 30*a'* and has conductive coatings 37 and 37' applied over the same areas of the sheet as the contiguous conductive coatings 36 and 36', so as to leave uncoated strips 40–40' along the opposite longitudinal edges of the sheet.

The coated sheets 30*a*, 30*a'* and 30*b* are cemented together to form a monolithic blank by applying suitable layers 39 and 39' of conductive epoxy material between the inner conductive coatings 36–37 and 36'–37'. The inner surfaces of the sheets 30*a*, 30*b* and 30*a'* have confronting pairs 34–40 and 34'–40' of uncoated strips which form spaces which are filled with an insulating epoxy 41–41' or similar material by dipping or coating the outer longitudinal edges of the laminate blank 30 in the material involved. Either before or after curing of the latter insulating epoxy, excess material left on the longitudinal edges of the laminate blank 30 are removed to restore the original dimensions of the body. Silver coatings 12 and 12' are then applied to the longitudinal edges of the laminate blank 30 in any suitable way to complete the blank.

The piezoelectric sheets 30*a* and 30*a'* can be polarized before they are assembled into the laminate blank 30, or after the laminate blank is formed but before the conductive coating 12 and 12' are applied thereto. The individual transducer bodies 4 are then formed by severing the laminate body 30 widthwise along dotted lines L1 indicated in FIG. 8 to form the rectangular body shown in FIG. 11.

A phonograph pickup device 1 is formed from the transducer body 4 by merely soldering or otherwise securing the carrier bar 22 having the attached phonograph needle 21 to one of the ends of the body. The opposite end of the transducer body may then be secured to a carrier arm 45 (FIG. 1) which anchors the latter end of the body with respect to the needle-carrying end thereof. The signal leads 10 and 10' are soldered to the opposite outer electrodes 8 and 8' of the transducer body, as shown in FIGS. 1 and 2.

It should be understood that numerous modifications may be made in the preferred form of the invention described above without deviating from the broader aspects thereof.

What we claim as new and desire to protect by Letters Patent of the United States is:

1. A transducer unit comprising: a monolithic laminate body comprising a pair of thin, flat piezoelectric elements each having conductive layers on the opposite sides thereof forming electrodes therefor, a thin, flat capacitor element having conductive layers on the opposite sides thereof forming capacitor plates on the opposite sides thereof, the capacitor element being sandwiched between said pair of piezoelectric elements with the capacitor plates and the adjacent inner electrodes of the piezoelectric elements forming common conductive layers of the laminate body, a pair of terminals for connecting the transducer unit to an external circuit, means electrically connecting one of said terminals to the outer electrode of one of said piezoelectric elements and the inner electrode of the other piezoelectric element, and means electrically connecting the outer electrode of the latter piezoelectric element to the inner electrode of the former piezoelectric element.

2. A transducer unit comprising: a monolithic laminate body comprising a pair of thin, flat piezoelectric elements each having conductive layers on the opposite sides thereof forming electrodes therefor, a thin, flat capacitor element having conductive layers on the opposite sides thereof forming capacitor plates on the opposite sides thereof, the capacitor element being sandwiched between said pair of piezoelectric elements with the capacitor plates and the adjacent inner electrodes of the piezoelectric elements forming common conductive layers of the laminate body, said piezoelectric elements being ferroelectric ceramic materials which are polarized in opposite directions wherein voltages of opposite polarities are developed between the outer and inner electrodes of the piezoelectric elements of the transducer unit when one of the piezoelectric elements is subjected to compression and the other is subjected to tension, force-receiving means for flexing the laminate body in a direction parallel to the spacing of the piezoelectric elements therein to subject the same simultaneously respectively to compression and tension, a pair of terminals for connecting the transducer unit to an external circuit, means electrically connecting one of said terminals to the outer electrode of one of said piezoelectric elements and the inner electrode of the other piezoelectric element, and means electrically connecting the outer electrode of the latter piezoelectric element to the inner electrode of the former piezoelectric element.

3. A transducer unit comprising a pair of thin, flat piezoelectric elements each having conductive layers on the opposite sides thereof forming electrodes therefor, a thin, flat capacitor element having conductive layers on the opposite sides thereof forming capacitor plates, the capacitor element being sandwiched between said pair of piezoelectric elements, means holding the piezoelectric and capacitor elements of the transducer unit together to form an integral structure, force-receiving means connected to the transducer unit for flexing the same in a direction parallel to the spacing of the piezoelectric elements to subject the same simultaneously respectively to compression and tension, connecting leads connecting the transducer unit to an external circuit, and means interconnecting said connecting leads and the electrodes of said piezoelectric elements to connect the voltage outputs of the piezoelectric elements in voltage aiding relationship across the connecting leads and the capacitor in parallel with said connecting leads.

4. A transducer unit comprising: a monolithic laminate body comprising a pair of thin, flat piezoelectric elements and a thin, flat capacitor element sandwiched between said piezoelectric elements, said piezoelectric and capacitor elements having common conductive layers forming inner electrodes for the piezoelectric elements and plates for the capacitor element, one of the common conductive layers extending to one of the edges of the laminate body and terminating short of one of the other edges of the laminate body and the other common conductive layer extending to the latter edge of the laminate body and terminating short of the former edge, outer conductive layers on the outer surfaces of said piezoelectric elements which respectively extend to said edges of the laminate body to which the adjacent associated inner conductive layers do not extend and respectively terminate short of the edges of the laminate body to which the adjacent associated inner conductive layers extend, said outer conductive layers forming outer electrodes for the piezoelectric elements, insulated conductive coatings on said respective edges of said laminate body which interconnect only the conductive layers extending to the edges involved, whereby the outer electrodes of each of said piezoelectric elements are connected to the remote plate of the capacitor element and the inner electrode of the other piezoelectric element, and a pair of transducer terminals respectively electrically connected across the outer conductive electrode layers of the laminate body.

5. A transducer unit comprising: a monolithic laminate body comprising a pair of thin, flat, rectangular piezoelectric elements and a thin, flat, rectangular capacitor element sandwiched between said piezoelectric elements, said piezoelectric and capacitor elements having common conductive layers forming inner electrodes for the piezoelectric elements and plates for the capacitor element, one of the common conductive layers extending to one of the edges of the laminate body and terminating short of one of the other edges of the laminate body and providing a space thereat between the confronting elements involved and the other common conductive layer extending to the latter edge of the laminate body and terminating short of the former edge and providing a space thereat between the confronting elements involved, insulating material filling said spaces between said elements, outer conductive layers on the outer surfaces of said piezoelectric elements which respectively extend to said edges of the laminate body to which the adjacent associated inner conductive layers do not extend and respectively terminate short the edges of the laminate body to which the adjacent associated inner conductive layers extend, said outer conductive layers forming outer electrodes for the piezoelectric elements, insulated conductive coatings on said respective edges of said laminate body which interconnect only the conductive layers extending to the edges involved, whereby the outer electrodes of each of said piezoelectric elements are connected to the remote plate of the capacitor element and the inner electrode of the other piezoelectric element, and a pair of transducer terminals respectively electrically connected across the outer conductive electrode layers of the laminate body.

6. A transducer unit comprising a monolithic laminate body comprising a pair of outer sheets of piezoelectric material, an intermediate sheet of insulating material, conductive layers bridging the space between said intermediate and outer sheets to form capacitor plates for the intermediate sheet of insulating material and inner electrodes for the piezoelectric sheets, the piezoelectric sheets having conductive layers on the outer sides thereof forming outer electrodes therefor, force-receiving means connected to the transducer unit for flexing the same in a direction parallel to the spacing of said sheets of material in the laminate body to subject the piezoelectric sheets simultaneously respectively to compression and tension, a pair of connecting leads for connecting the transducer unit to an external circuit, and conductor means interconnecting said connecting leads and the electrodes of said piezoelectric sheets to connect the piezoelectric sheets in parallel with said capacitor and the voltage outputs of the piezoelectric sheets in voltage aiding relationship.

7. A transducer unit comprising a monolithic laminate body comprising a pair of outer sheets of piezoelectric material, an intermediate sheet of insulating material, conductive layers bridging the space between said intermediate and outer sheets to form capacitor plates for the intermediate sheet of insulating material and inner electrodes for the piezoelectric sheets, the piezoelectric sheets having conductive layers on the outer sides thereof forming outer electrodes therefor, force-receiving means connected to the transducer unit for flexing the same in a direction parallel to the spacing of said sheets of material in the laminate body to subject the piezoelectric sheets simultaneously respectively to compression and tension, a pair of connecting leads for connecting the transducer unit to an external circuit, said piezoelectric sheets being made of ferroelectric ceramic material polarized in opposite directions where voltages of opposite polarities are developed between the outermost and innermost electrodes of the piezoelectric sheets when one is subjected to compression and the other is subjected to tension, conductor means forming a first conductive path between the outer electrode of one of said piezoelectric sheets to the inner electrode of the other piezoelectric sheet, and means forming a second conductive path between the outer electrode of the latter piezoelectric sheet and the inner electrode of the former piezoelectric sheet, and a pair of connecting leads for connecting the transducer unit to an external circuit and connected respectively to said first and second conductive paths.

8. The transducer unit of claim 6 wherein the conductor means interconnecting said connecting leads and the electrodes of the piezoelectric sheets comprise conductive coatings on the outer surfaces of the transducer unit which makes selective contact with the electrodes of the piezoelectric sheets and the plates of the capacitor, the latter electrodes extending to the outer surfaces of the transducer unit to make direct connection with said conductive coatings.

No references cited.